United States Patent
Cho

(10) Patent No.: US 8,750,068 B2
(45) Date of Patent: Jun. 10, 2014

(54) MEMORY SYSTEM AND REFRESH CONTROL METHOD THEREOF

(75) Inventor: Geun Hee Cho, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 59 days.

(21) Appl. No.: 13/477,300

(22) Filed: May 22, 2012

(65) Prior Publication Data

US 2012/0300569 A1  Nov. 29, 2012

(30) Foreign Application Priority Data

May 24, 2011  (KR) .................. 10-2011-0048901

(51) Int. Cl.
  *G11C 7/00*  (2006.01)
  *G11C 11/401*  (2006.01)
  *G11C 11/406*  (2006.01)
(52) U.S. Cl.
  CPC ............ *G11C 11/401* (2013.01); *G11C 11/406* (2013.01); *G11C 11/40615* (2013.01)
  USPC ............................ 365/222; 365/149; 365/239
(58) Field of Classification Search
  CPC ................................................... G11C 11/401
  USPC .................... 365/222, 185.25, 149, 236, 239
  See application file for complete search history.

(56) References Cited

U.S. PATENT DOCUMENTS

| 5,633,827 | A | 5/1997 | Numata et al. | |
| 6,167,484 | A * | 12/2000 | Boyer et al. | 711/106 |
| 6,654,303 | B2 * | 11/2003 | Miyamoto et al. | 365/222 |
| 6,721,223 | B2 * | 4/2004 | Matsumoto et al. | 365/222 |
| 7,057,960 | B1 * | 6/2006 | Fiscus et al. | 365/222 |
| 7,158,433 | B2 * | 1/2007 | Riho et al. | 365/222 |
| 7,231,488 | B2 * | 6/2007 | Poechmueller | 711/106 |
| 7,484,140 | B2 | 1/2009 | Pelley et al. | |

FOREIGN PATENT DOCUMENTS

| JP | 2001-043677 A | 2/2001 |
| KR | 10-2004-0101677 A | 12/2004 |

\* cited by examiner

*Primary Examiner* — Tan Nguyen
(74) *Attorney, Agent, or Firm* — Harness, Dickey & Pierce, P.L.C.

(57) ABSTRACT

A memory system and a refresh control method thereof are provided. The memory system includes a semiconductor memory device including a plurality of memory cells and a memory controller configured to generate a special command for searching for refresh information stored in the semiconductor memory device and to control a refresh operation of the semiconductor memory device. The semiconductor memory device is configured to output the refresh information to the memory controller in response to the special command generated by the memory controller.

15 Claims, 10 Drawing Sheets

FIG. 5A

| DQ31~16 | DQ15 | DQ14 | DQ13 | DQ12 | DQ11 | DQ10 | DQ9 | DQ8 | DQ7 | DQ6 | DQ5 | DQ4 | DQ3 | DQ2 | DQ1 | DQ0 |
|---|---|---|---|---|---|---|---|---|---|---|---|---|---|---|---|---|
| Reserved | Density | | | Type | Org. | Refresh Information | | | 0 | 0 | 0 | 1 | Manufacturer ID | | | |

FIG. 5B

| Group | Range | Refresh Information | Bit |
|---|---|---|---|
| Group1 | 30ms ~ 50ms | 30ms | 000 |
| Group2 | 50ms ~ 70ms | 50ms | 001 |
| Group3 | 70ms ~ 90ms | 70ms | 010 |
| ... | | ... | |

MEMORY SYSTEM AND REFRESH CONTROL METHOD THEREOF

CROSS-REFERENCE TO RELATED APPLICATIONS

This application claims priority under 35 U.S.C. §119(a) from Korean Patent Application No. 10-2011-0048901 filed on May 24, 2011, in the Korean Intellectual Property Office (KIPO), the entire contents of which are incorporated herein by reference.

BACKGROUND

1. Field

At least one example embodiment relates to a memory system and/or a refresh control method thereof, and more particularly, to a memory system with improved performance and/or refresh control method thereof.

2. Related Art

There has been large demand on large-capacity dynamic random access memory (DRAM) for mobile electronic products including smart phones. Generally, data stored in memory cells of semiconductor memory devices such as DRAM may be changed due to leakage current. Accordingly, a refresh is required to periodically recharge the data stored in the memory cells.

In addition, with the development of memory systems including semiconductor memory devices, the number of semiconductor memory devices included in a single module or memory system is increasing.

In refreshing a plurality of semiconductor memory devices included in a memory system, the same refresh operation is performed even if refresh characteristics of the semiconductor memory devices are different from each other. In other words, a refresh operation is performed on a plurality of semiconductor memory devices based on the refresh characteristic of the worst cell among a plurality of memory cells included in the semiconductor memory devices, and therefore, a refresh interval may be unnecessarily short for semiconductor memory devices having good refresh characteristics, which leads to an increase in power consumption.

Therefore, it is desired to perform refresh operations on a plurality of semiconductor memory devices based on different refresh characteristics, thereby increasing the performance of a memory system.

SUMMARY

According to at least some example embodiments, there is provided a memory system including a semiconductor memory device including a plurality of memory cells and a memory controller configured to generate a special command for searching for refresh information stored in the semiconductor memory device and to control a refresh operation of the semiconductor memory device. The semiconductor memory device outputs the refresh information to the memory controller in response to the special command generated by the memory controller.

The memory controller may include a command generator configured to generate the special command for searching for the refresh information corresponding to the semiconductor memory device before generating commands for controlling other operations of the semiconductor memory device; a memory register storage device configured to store the refresh information output from the semiconductor memory device; a pulse generator configured to generate and output a refresh pulse corresponding to the refresh information in response to a refresh command generated by the command generator; and an address counter configured to sequentially generate a row address for selecting a word line connected with a memory cell to be refreshed among the plurality of memory cells in response to the refresh pulse.

According to at least some of the example embodiments, there is provided a refresh control method of a memory system. The refresh control method includes applying a special command to a semiconductor memory device for controlling the semiconductor memory device to search for refresh information stored in the semiconductor memory device; outputting from the semiconductor memory device the refresh information in response to the special command; and controlling a refresh operation of the semiconductor memory device according to the refresh information.

According to at least one example embodiment, a memory controller for controlling the operations of at least one memory device may include a command generator configured to generate a request command and send the request command to the at least one memory device, the request command requesting refresh characteristic information of the at least one memory device from the at least one memory device; a memory register storage device configured to receive and store the requested refresh characteristic information of the at least one memory device; and a pulse generator configured to generate and output to the at least one memory device a refresh pulse corresponding to the stored refresh characteristic information, the refresh pulse being configured to cause the at least one memory device to perform a refresh operation.

According to at least one example embodiment, a memory device for storing data in response to control signals of a memory controller may include a plurality of memory cells; a refresh control circuit configured to perform a refresh operation on the plurality of memory cells in response to a refresh pulse received from the memory controller; and a refresh information storage device configured to store refresh characteristic information and to provide the refresh characteristic information to the memory controller in response to a request command from the memory controller.

BRIEF DESCRIPTION OF THE DRAWINGS

The above and other features and advantages of example embodiments will become more apparent by describing in detail example embodiments with reference to the attached drawings. The accompanying drawings are intended to depict example embodiments and should not be interpreted to limit the intended scope of the claims. The accompanying drawings are not to be considered as drawn to scale unless explicitly noted.

FIG. 5A is a diagram of an example of status register read (SRR) data stored in an SRR circuit;

FIG. 5B is a diagram showing refresh characteristic information grouped to performing a refresh control method according to at least some example embodiments;

DETAILED DESCRIPTION OF THE EMBODIMENTS

Figure 1:
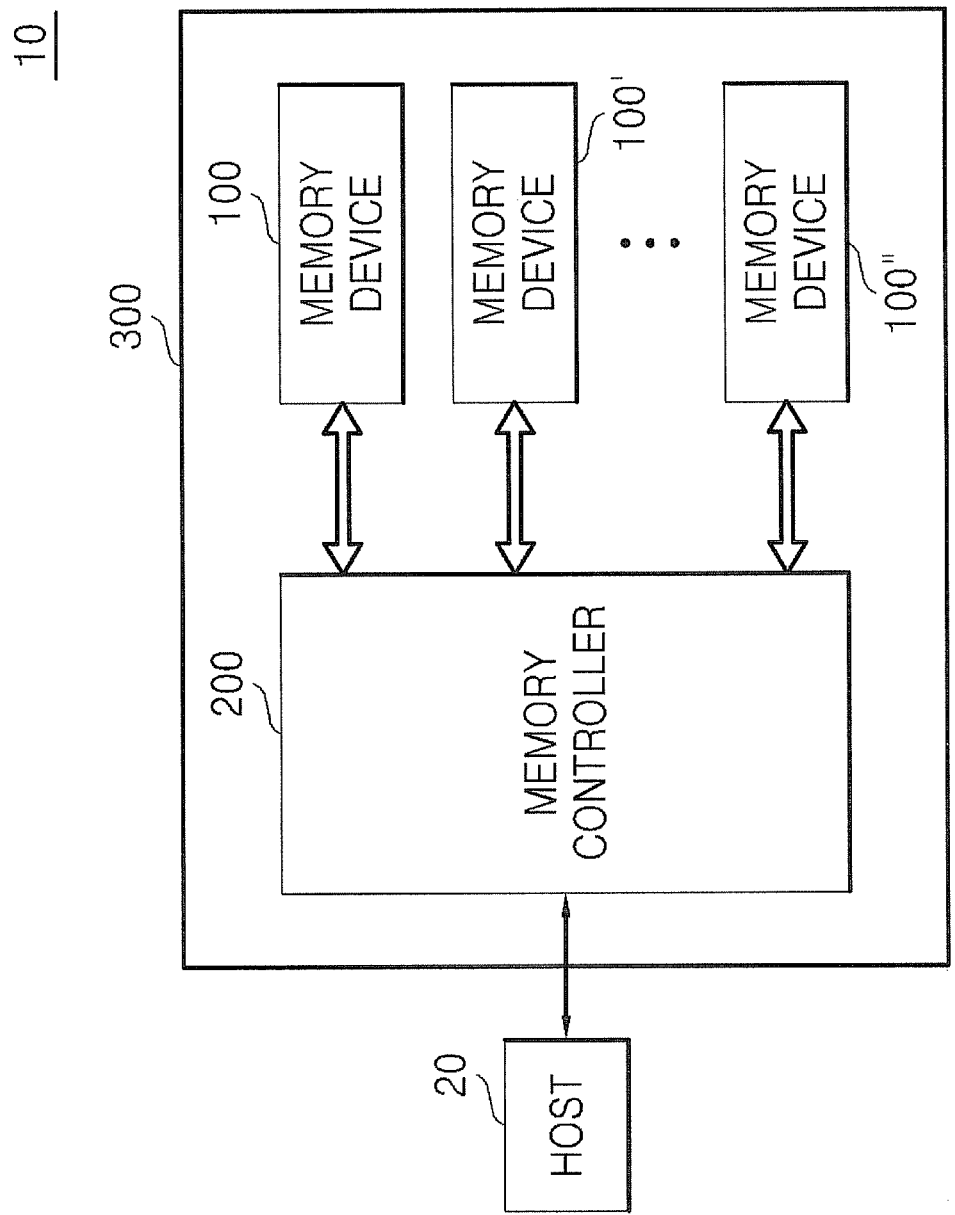
FIG. 1 is a schematic block diagram of an electronic system according to at least some example embodiments.

Detailed example embodiments are disclosed herein. However, specific structural and functional details disclosed herein are merely representative for purposes of describing example embodiments. Example embodiments may, however, be embodied in many alternate forms and should not be construed as limited to only the embodiments set forth herein.

Accordingly, while example embodiments are capable of various modifications and alternative forms, embodiments thereof are shown by way of example in the drawings and will herein be described in detail. It should be understood, however, that there is no intent to limit example embodiments to the particular forms disclosed, but to the contrary, example embodiments are to cover all modifications, equivalents, and alternatives falling within the scope of example embodiments. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

It will be understood that when an element is referred to as being "connected" or "coupled" to another element, it may be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between", "adjacent" versus "directly adjacent", etc.).

The terminology used herein is for the purpose of describing particular embodiments only and is not intended to be limiting of example embodiments. As used herein, the singular forms "a", "an" and "the" are intended to include the plural forms as well, unless the context clearly indicates otherwise. It will be further understood that the tennis "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

FIG. 1 is a schematic block diagram of an electronic system 10 according to at least some example embodiments. The electronic system 10 includes a memory system 300 and a host 20. The memory system 300 may include a memory controller 200 and first through third semiconductor memory devices 100, 100', and 100". Though, for the purpose of simplicity, only first through third semiconductor memory devices 100, 100' and 100" are illustrated, the memory system 300 may include any number of semiconductor memory devices.

The host 20 may communicate with the memory system 300 using an interface protocol such as a peripheral component interconnect express (PCI-E) protocol, an advanced technology attachment (ATA) protocol, a serial ATA (SATA) protocol, a parallel ATA (PATA) protocol, or a serial attached SCSI (SAS) protocol. However, the interface protocol between the host 20 and the memory system 300 is not restricted to those examples and may be one of other interface protocols such as a universal serial bus (USB) protocol, a multimedia card (MMC) protocol, an enhanced small disk interface (ESDI) protocol and an integrated drive electronics (IDE) protocol.

According to at least one example embodiment, the memory system 300 may be installed in systems such as mobile equipment, notebooks, and desktop computers.

The memory controller 200 controls the overall operation of the memory system 300 and controls overall data communication between the host 20 and the first through third semiconductor memory devices 100, 100' and 100". For instance, the memory controller 200 controls the first through third semiconductor memory devices 100, 100' and 100" to write or read data at the request of the host 20.

The memory controller 200 applies commands to the first through third semiconductor memory devices 100, 100', and 100" to control the operations of the first through third semiconductor memory devices 100, 100', and 100". The memory controller 200 may also apply a special command to the first through third semiconductor memory devices 100, 100', and 100" to search for the refresh information of the first through third semiconductor memory devices 100, 100', and 100".

The first through third semiconductor memory devices 100, 100', and 100" store desired (or, alternatively predetermined) refresh information according to their own characteristics. The first through third semiconductor memory devices 100, 100', and 100" also output the refresh information to the memory controller 200 in response to the special command generated from the memory controller 200.

Figure 2:
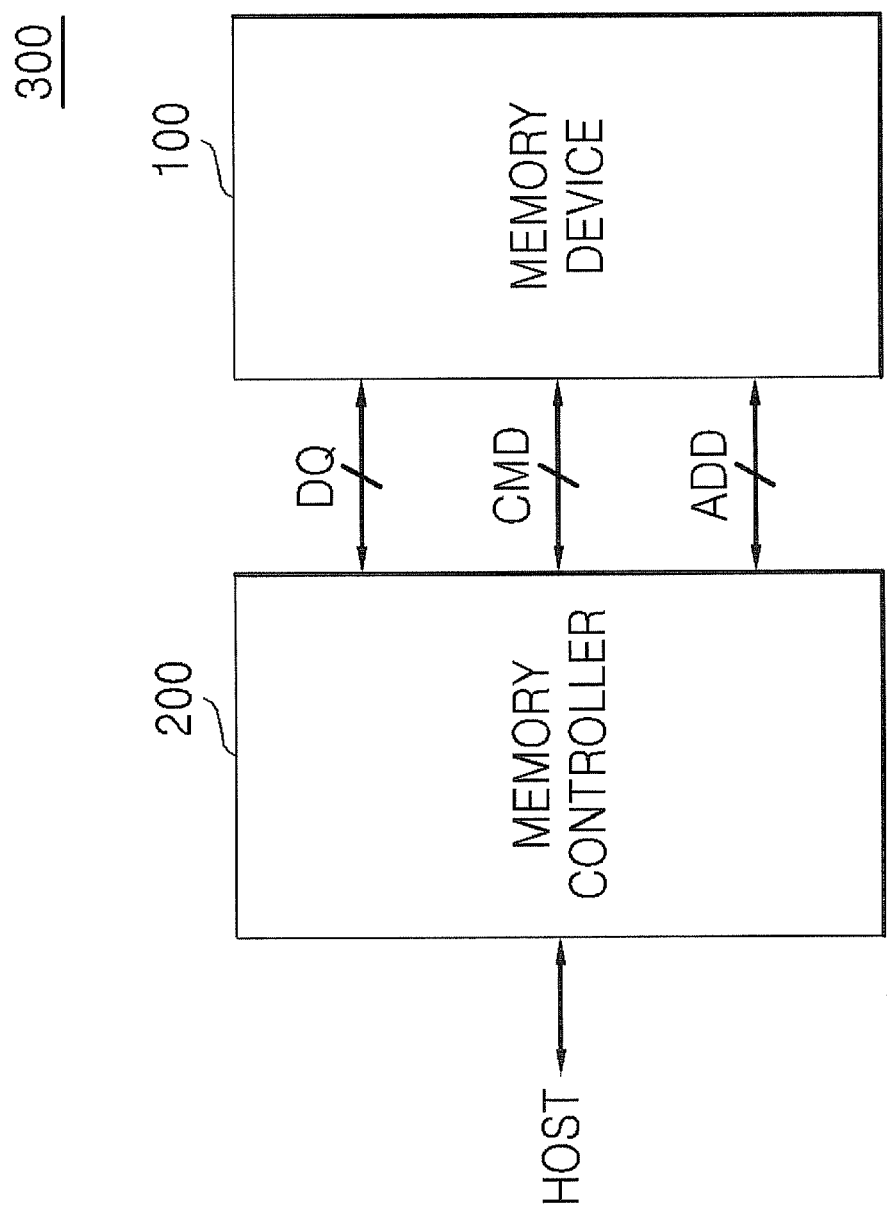
FIG. 2 is a schematic block diagram of a memory system according to at least some example embodiments.

FIG. 2 is a schematic block diagram of the memory system 300 according to at least some example embodiments. For the purpose of simplicity, only the first semiconductor memory device 100 corresponding to the memory controller 200 will be explained as an example. However, according to at least one example embodiment, each of the other semiconductor memory devices included in the memory system 300 may have the same structure and operation as the first semiconductor memory device 100. Referring to FIG. 2, the memory controller 200 controls data to be input to or output from the semiconductor memory device 100 through a data pin DQ based on the request of the host 20.

The memory controller 200 applies a command CMD for an active operation of the semiconductor memory device 100 and an address signal ADD to the semiconductor memory device 100, then applies a command CMD for a write operation and a read operation and an address signal ADD to the semiconductor memory device 100, and then applies a command CMD for a refresh operation and an address signal ADD to the semiconductor memory device 100. These apply operations are sequentially performed.

In addition, the memory controller 200 applies a special command for searching for refresh information stored in the semiconductor memory device 100 to the semiconductor memory device 100. The semiconductor memory device 100 sends the refresh information to the memory controller 200 in response to the special command.

Figure 3:
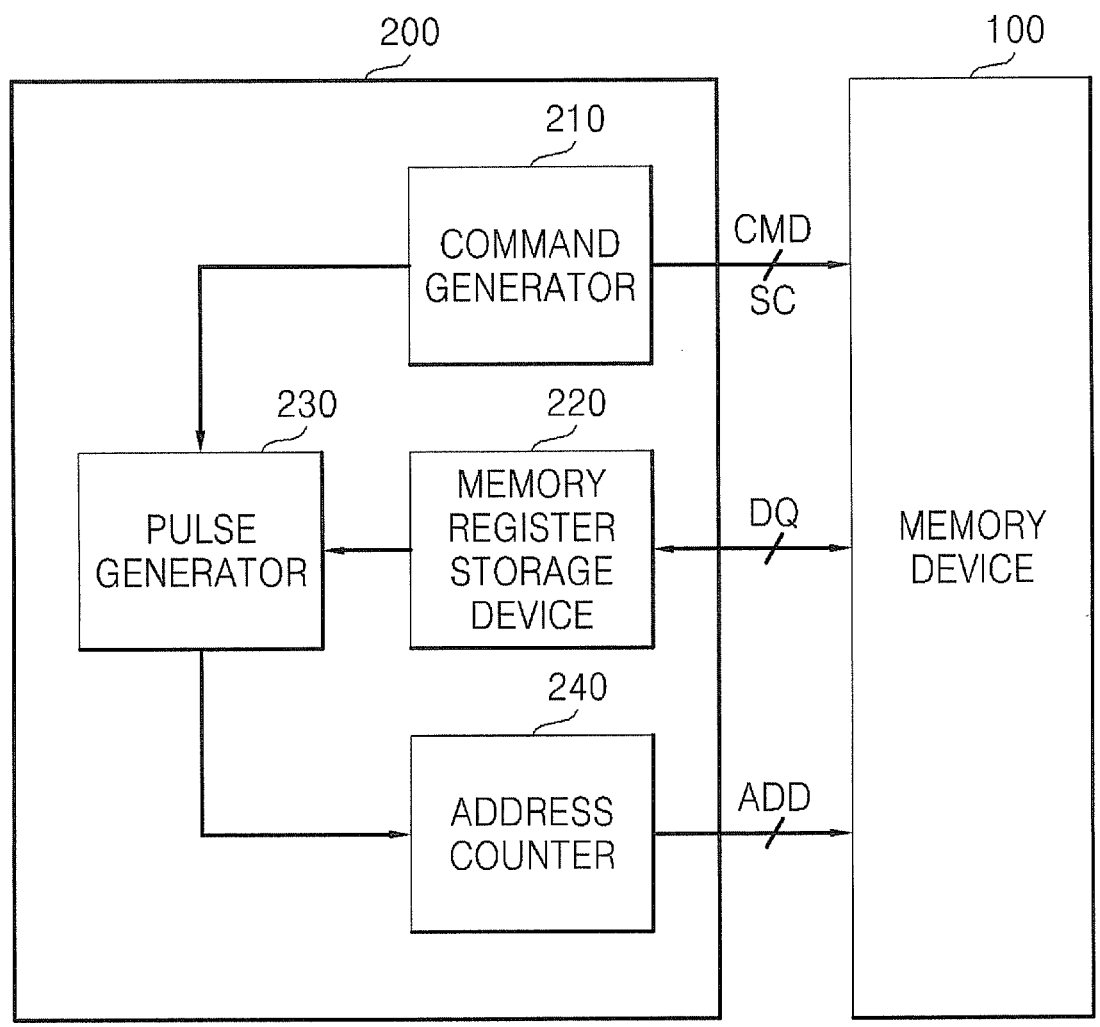
FIG. 3 is a schematic block diagram of a memory controller illustrated in FIG. 2.

FIG. 3 is a schematic block diagram of the memory controller 200 illustrated in FIG. 2. Referring to FIGS. 1 through 3, the memory controller 200 includes a command generator 210, a memory register storage device 220, a pulse generator 230, and an address counter 240.

The command generator 210 applies a special command SC to the semiconductor memory device 100 for searching for refresh information of the semiconductor memory device 100. The semiconductor memory device 100 sends the refresh information stored in the form of a bit value therein to the memory register storage device 220 through a data pin DQ in response to the special command SC.

The memory register storage device 220 temporarily stores the bit value of the refresh information received from the semiconductor memory device 100 and then outputs them to the pulse generator 230. At each time when a semiconductor memory device corresponding to the memory controller 200 is changed, the memory register storage device 220 receives refresh information from the semiconductor memory device and temporarily stores it, for example, in response to the special command SC. The refresh information may be different depending on the semiconductor memory device producing the refresh information.

The pulse generator 230 generates a pulse based on the bit value stored in the memory register storage device 220 in response to a refresh command generated by the command generator 210 so that the semiconductor memory device 100 carries out a refresh operation at a refresh interval corresponding to the bit value.

The address counter 240 sequentially generates a row address ADD for selecting a word line to be refreshed in the semiconductor memory device 100 in response to the refresh pulse.

Figure 4:
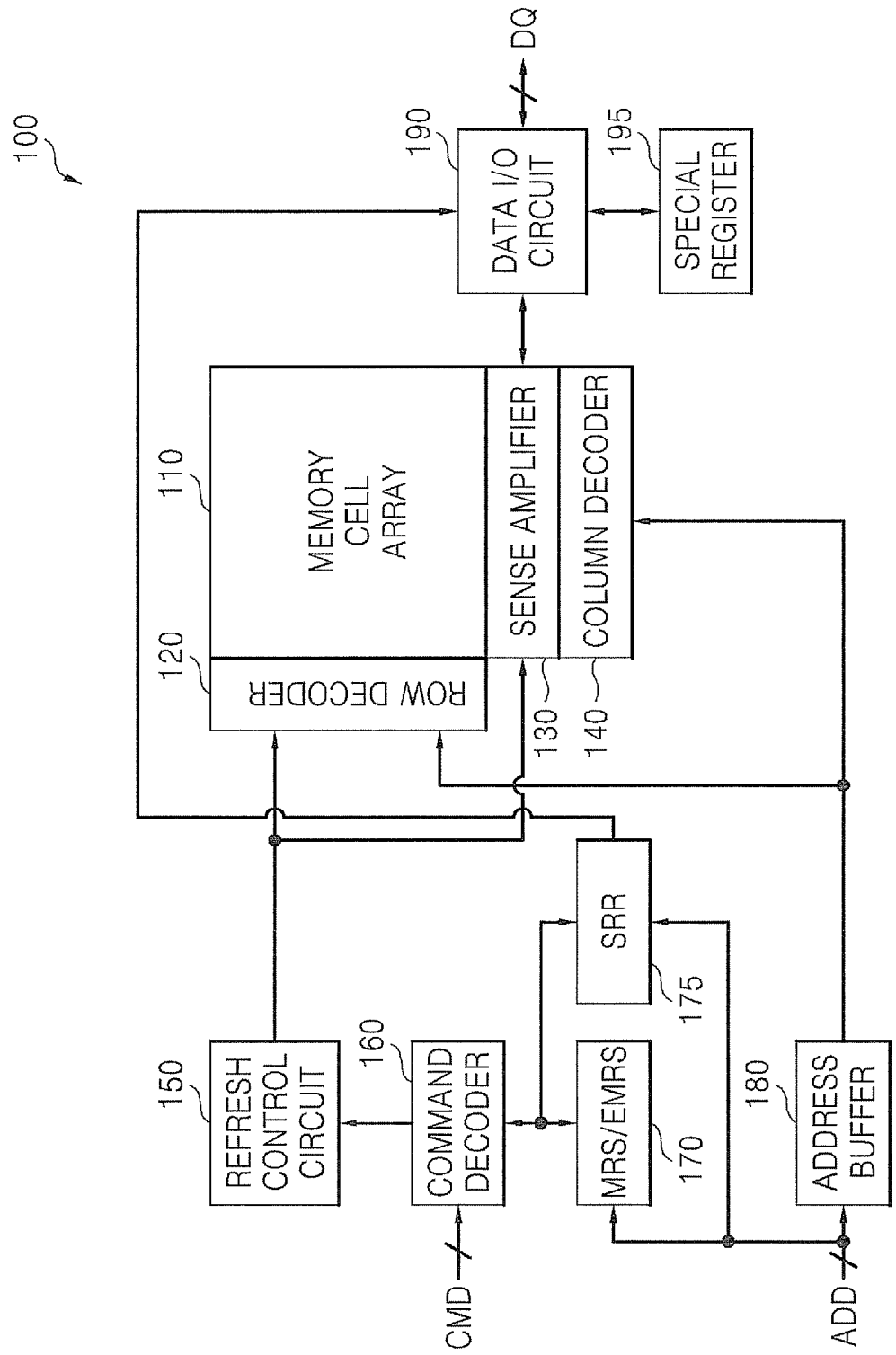
FIG. 4 is a schematic block diagram of a semiconductor memory device illustrated in FIG. 3.

FIG. 4 is a schematic block diagram of the semiconductor memory device 100 illustrated in FIG. 3. Referring to FIGS. 1 through 4, the semiconductor memory device 100 includes a memory cell array 110, a row decoder 120, a sense amplifier 130, a column decoder 140, a refresh control circuit 150, a command decoder 160, a mode register set/extended mode register set (MRS/EMRS) circuit 170, a status register read (SRR) circuit 175, an address buffer 180, a data input/output (I/O) circuit 190, and a special register 195. The schematic operation of the semiconductor memory device 100 will be described below.

The memory cell array 110 is a data storage in which a plurality of memory cells is arranged in a row direction and a column direction. The sense amplifier 130 senses and amplifies data of the memory cells and stores data to the memory cells. According to the example illustrated in FIG. 4, the memory cell array 110 illustrated may include four memory banks (e.g., first through fourth memory banks).

Data DQ input through the data I/O circuit 190 is written to the memory cell array 110 based on an address signal ADD. Data DQ read from the memory cell array 110 based on an address signal ADD is output to the memory controller 200 through the data I/O circuit 190.

The address signal ADD indicating a memory cell which the data DQ is written to or read from is input to the address buffer 180. The address buffer 180 temporarily stores the address signal ADD received from the memory controller 200.

The special register 195 may store refresh information of the semiconductor memory device 100 in the form of a predetermined bit value. The special register 195 may output the bit value corresponding to the refresh information to the memory register storage device 220 through a data pin DQ in response to the special command SC received from the memory controller 200.

The row decoder 120 decodes a row address in the address signal received from the address buffer 180 in order to designate a word line connected with a memory cell which data will be input to or output from.

In other words, the row decoder 120 decodes a row address received from the address buffer 180 and enables a word line corresponding to the row address in a write or read mode. The row decoder 120 also designates a word line based on a row address received from the refresh control circuit 150 so that the word line is refreshed.

The column decoder 140 decodes a column address in the address signal received from the address buffer 180 in order to designate a bit line connected with a memory cell which data will be input to or output from.

The memory cell array 110 outputs data from or writes data to a memory cell designated by a row address and a column address.

The command decoder 160 receives a command CMD from the memory controller 200 and decodes the command CMD, thereby internally generating a decoded command signal, e.g., an active signal, a read signal, a write signal, or a refresh signal.

The refresh control circuit 150 receives a refresh signal from the command decoder 160 and outputs an internal row address to the row decoder 120 so that a single word line in the memory cell array 110 is refreshed.

The MRS/EMRS circuit 170 sets an internal mode register in response to the address signal ADD and an MRS/EMRS command for setting an operation mode of the semiconductor memory device 100.

The SRR circuit 175 stores SRR data including status information of the semiconductor memory device 100 such as manufacturer ID information and density information and outputs the SRR data at the request of the memory controller 200 through, for example, the data I/O circuit 190.

At this time, a code for the SRR circuit 175 to output the status information of the semiconductor memory device 100 to the memory controller 200 has been standardized by the Joint Electron Device Engineering Council (JEDEC). Apart from the standardized code, the SRR circuit 175 according to at least one example embodiment has a part reserved for a test or other special usages.

FIG. 5A is a diagram of an example of SRR data stored in the SRR circuit 175. The SRR circuit 175 stores refresh information corresponding to the semiconductor memory device 100 in the form of a bit value and transmits the refresh information using some of unused bits apart from bits used to transmit the SRR data. The SRR circuit 175 transmits the refresh information together with the SRR data to the memory controller 200 through data pin DQ in response to an SRR command received from the command generator 210.

Referring to FIG. 5A, three bits DQ8 to DQ10 in the SRR circuit 175 are allocated to store the refresh information. However, according to at least one example embodiment, the number and the position of bits allocated for the refresh information may be changed.

Although not shown in FIG. 4, the semiconductor memory device 100 may also include a clock circuit (not shown) which generates a clock signal and a power supply circuit (not shown) which receives an external power supply voltage and generates or distributes an internal voltage.

Although both the SRR circuit 175 and the special register 195 are included in the semiconductor memory device 100 in the embodiments illustrated in FIG. 4, according to at least one example embodiment, only one between the SRR circuit 175 and the special register 195 may be provided.

FIG. 5B is a diagram showing refresh characteristic information for performing a refresh control method for each of a plurality of groups according to at least some example embodiments. FIG. 5B shows refresh characteristics different among different ones of the first through third semiconductor memory devices 100, 100' and 100". Refresh intervals of the first through third semiconductor memory devices 100, 100' and 100" may be grouped by predetermined or reference ranges.

For instance, a first group Group 1 includes semiconductor memory devices having refresh intervals of 30 to 50 ms. For the semiconductor memory devices in the first group Group 1, the worst characteristic, i.e., 30 ms, in the range of the refresh intervals is set as a refresh interval so that the semiconductor memory devices in the first group Group 1 carry out a refresh operation at an interval of 30 ms.

At this time, the semiconductor memory devices in the first group Group 1 may store a 3-bit value of "000" as refresh information in the special register 195 or the SRR circuit 175 and the memory controller 200 may search for the refresh info illation stored in the special register 195 or the SRR circuit 175 and control the semiconductor memory device 100 to carry out a refresh operation at a refresh interval corresponding to the refresh information. As is illustrated in FIG. 5B, according to at least one example embodiment, refresh information of a plurality of semiconductor memory devices is divided into eight groups according to predetermined ranges of refresh intervals. For the purpose of simplicity, only three of the eight groups are shown.

Figure 6:
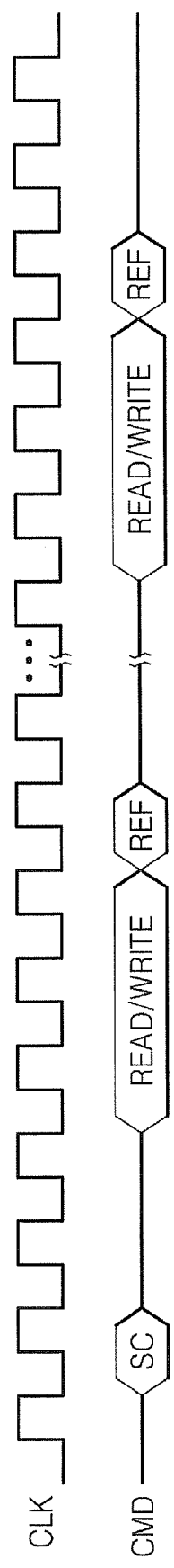
FIG. 6 is a diagram for explaining a refresh control method according to at least some example embodiments.

FIG. 6 is a diagram for explaining a refresh control method according to at least some example embodiments. Referring to FIGS. 1 through 6, before generating a command CMD for an operation of the semiconductor memory device 100 after power is applied to the semiconductor memory device 100, the command generator 210 of the memory controller 200 generates an MRS command, an SRR command or a special command SC as a command CMD and applies them to the MRS/EMRS circuit 170, the SRR circuit 175 and the special register 195, respectively.

Upon receiving the special command SC from the command generator 210, the special register 195 outputs refresh information to the memory controller 200 and the memory controller 200 controls the refresh operation of the semiconductor memory device 100 according to a refresh interval corresponding to the refresh information.

Upon receiving the SRR command CMD from the command generator 210, the SRR circuit 175 outputs refresh information of the semiconductor memory device 100, which has been stored in part of the SRR circuit 175, to the memory controller 200.

Then, the memory controller 200 controls the refresh operation of the semiconductor memory device 100 according to a refresh interval corresponding to the refresh information that has been output from the SRR circuit 175 together with SRR data.

At this time, the memory controller 200 controls the refresh operation of the semiconductor memory device 100 at the refresh interval corresponding to the refresh information in an idle state of the semiconductor memory device 100 after a data I/O operation on the semiconductor memory device 100 is completed.

In other words, the memory controller 200 generates the special command SC or the SRR command CMD once before generating commands for controlling the data processing operations of the first through third semiconductor memory devices 100, 100' and 100", so that each of the first through third semiconductor memory devices 100, 100' and 100" carries out a refresh operation according to its own refresh characteristic in the memory system 300.

Figure 7:
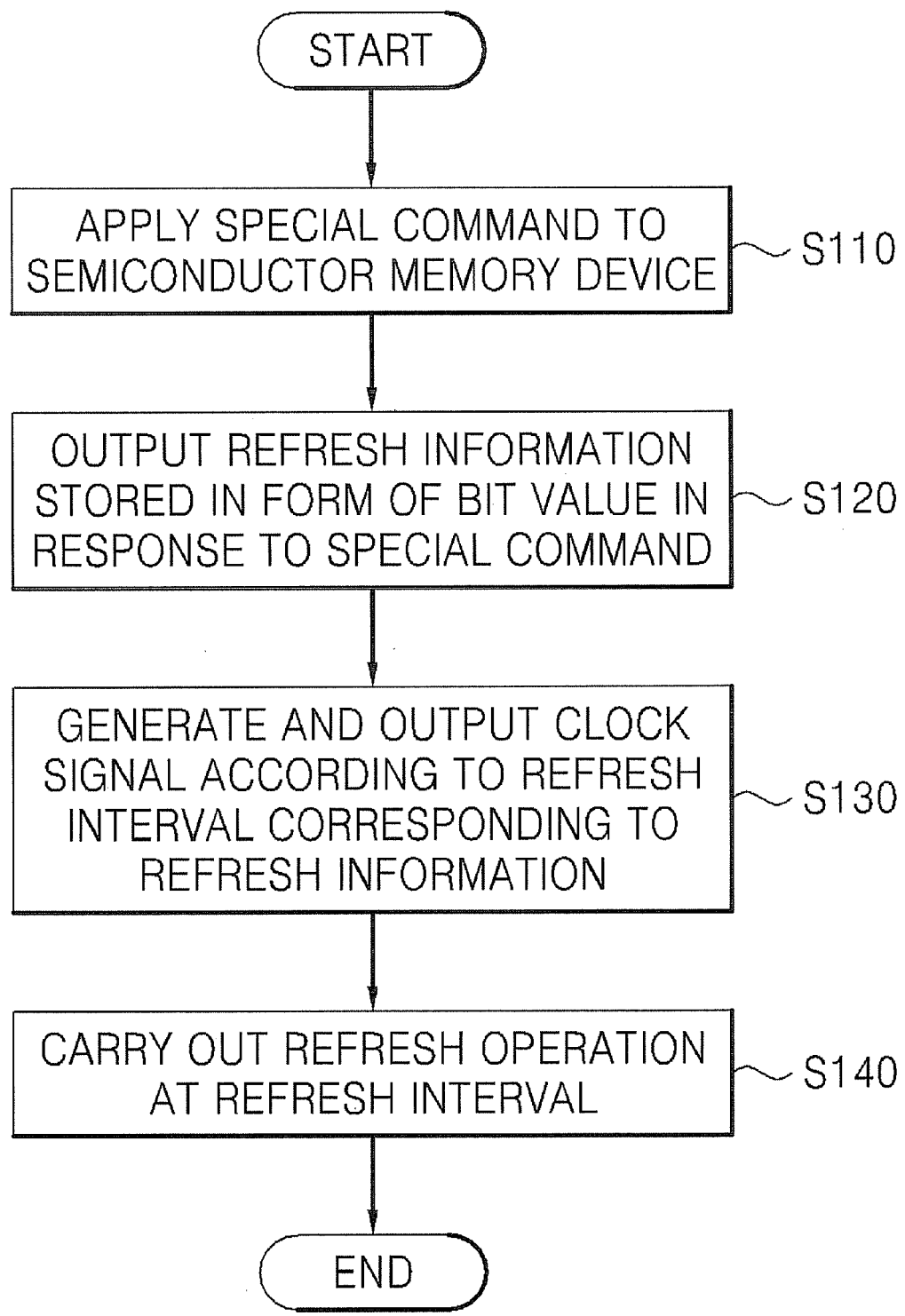
FIG. 7 is a flowchart of a refresh control method of a memory system according to at least some example embodiments.

FIG. 7 is a flowchart of a refresh control method of the memory system 300 according to at least some example embodiments. Referring to FIGS. 1 through 7, after the semiconductor memory device 100 is powered up, the memory controller 200 applies the special command SC to the semiconductor memory device 100 in operation S110 to search for refresh information of the semiconductor memory device 100 before performing data I/O operations on the semiconductor memory device 100.

The semiconductor memory device 100 outputs the refresh information stored in the special register 195 in the faun of a bit value in response to the special command SC in operation S120.

The memory controller 200 generates a clock signal according to a refresh interval corresponding to the refresh information based on the refresh information received from the semiconductor memory device 100 and outputs the clock signal to the semiconductor memory device 100 in operation S130. Then, in operation S140 the semiconductor memory device 100 carries out a refresh operation at the refresh interval corresponding to the semiconductor memory device 100 when it is in an idle mode after performing a data I/O operation.

Accordingly, a refresh operation is carried out based on different refresh information stored in each of the first through third semiconductor memory devices 100, 100' and 100", thereby increasing the performance of the memory system 300.

Figure 8:
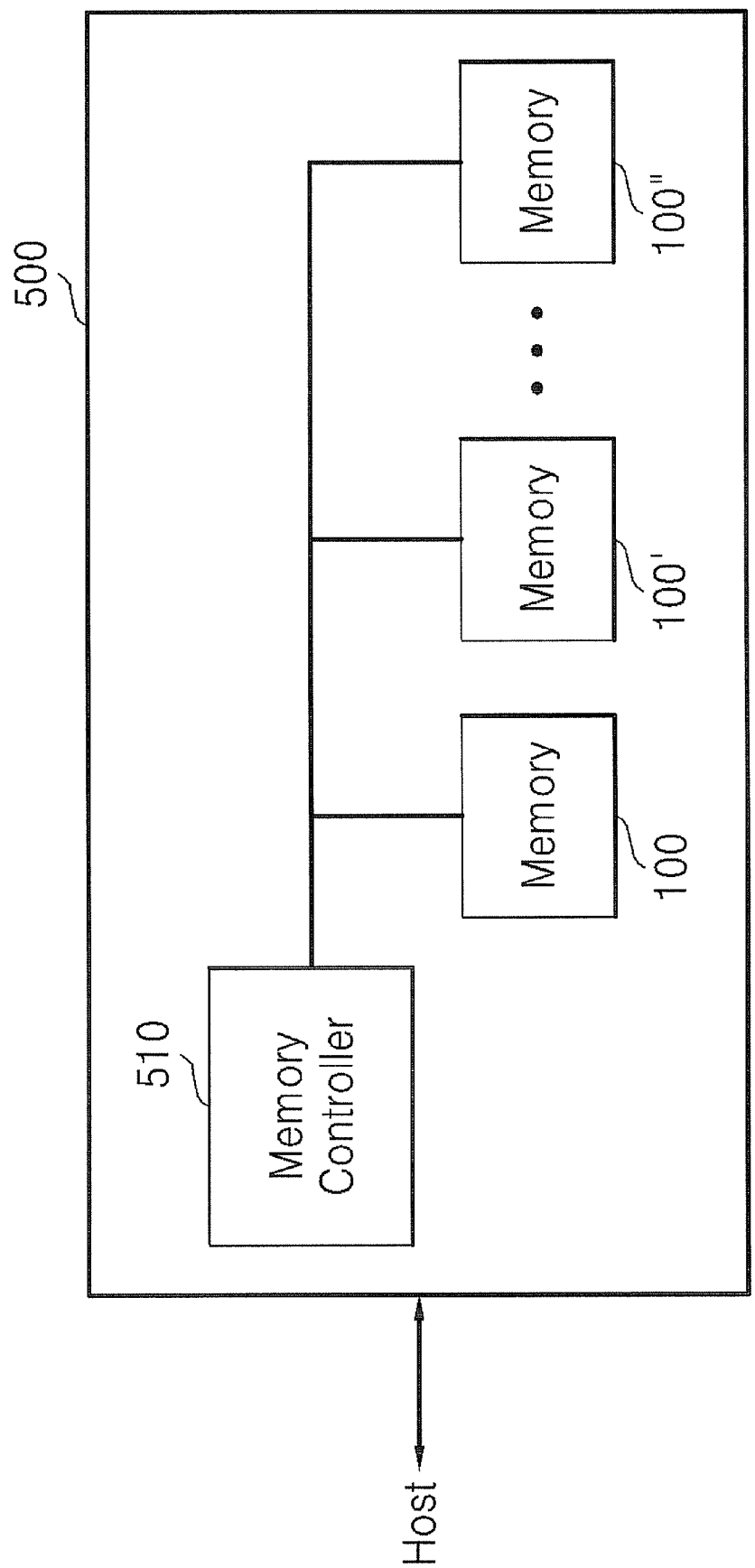
FIG. 8 is a block diagram of a memory module according to at least some example embodiments.

FIG. 8 is a block diagram of a memory module 500 according to at least some example embodiments. The memory module 500 includes the semiconductor memory device 100 and the memory controller 200 controlling the semiconductor memory device 100.

The structures and the operations of the semiconductor memory device 100 and the memory controller 200 are discussed above with reference to FIGS. 1 through 7, and therefore, detailed descriptions thereof will be omitted.

According to at least some example embodiments, the semiconductor memory device 100 and/or the memory controller 200 may be implemented by using a variety of packages. For example, the semiconductor memory device 100 and/or the memory controller may be implemented by using packages such as package on packages (PoPs), ball grid arrays (BGAs), chip scale packages (CSPs), plastic leaded chip carriers (PLCCs), plastic dual in-line packages (PDIPs), die in waffle packs, die in wafer forms, chip on boards (COBs), ceramic dual in-line packages (CERDIPs), plastic metric quad flat packs (MQFPs), thin quad flatpacks (TQFPs), small outlines (SOICs), shrink small outline packages (SSOPs), thin small outlines (TSOPs), system in packages (SIPs), multi chip packages (MCPs), wafer-level fabricated packages (WFPs), and wafer-level processed stack packages (WSPs). Also, according to at least one example embodiment, the semiconductor memory device 100 and the memory controller 200 may constitute a memory card. In this case, the memory controller may be configured to communicate with an external apparatus, for example, a host, through one of various interface protocols such as USB (Universal Serial Bus), MMC (multi-media card), PCI-E (peripheral component interconnect-express), SATA (serial ATA), PATA (parallel ATA), SCSI (small computer system interface), ESDI (enhanced small disk interface), and IDE (Integrated Drive Electronics).

A semiconductor memory device or a memory system according to at least some example embodiments may be installed in an electronic system. An example of the electronic system is illustrated in FIG. 9.

Figure 9:
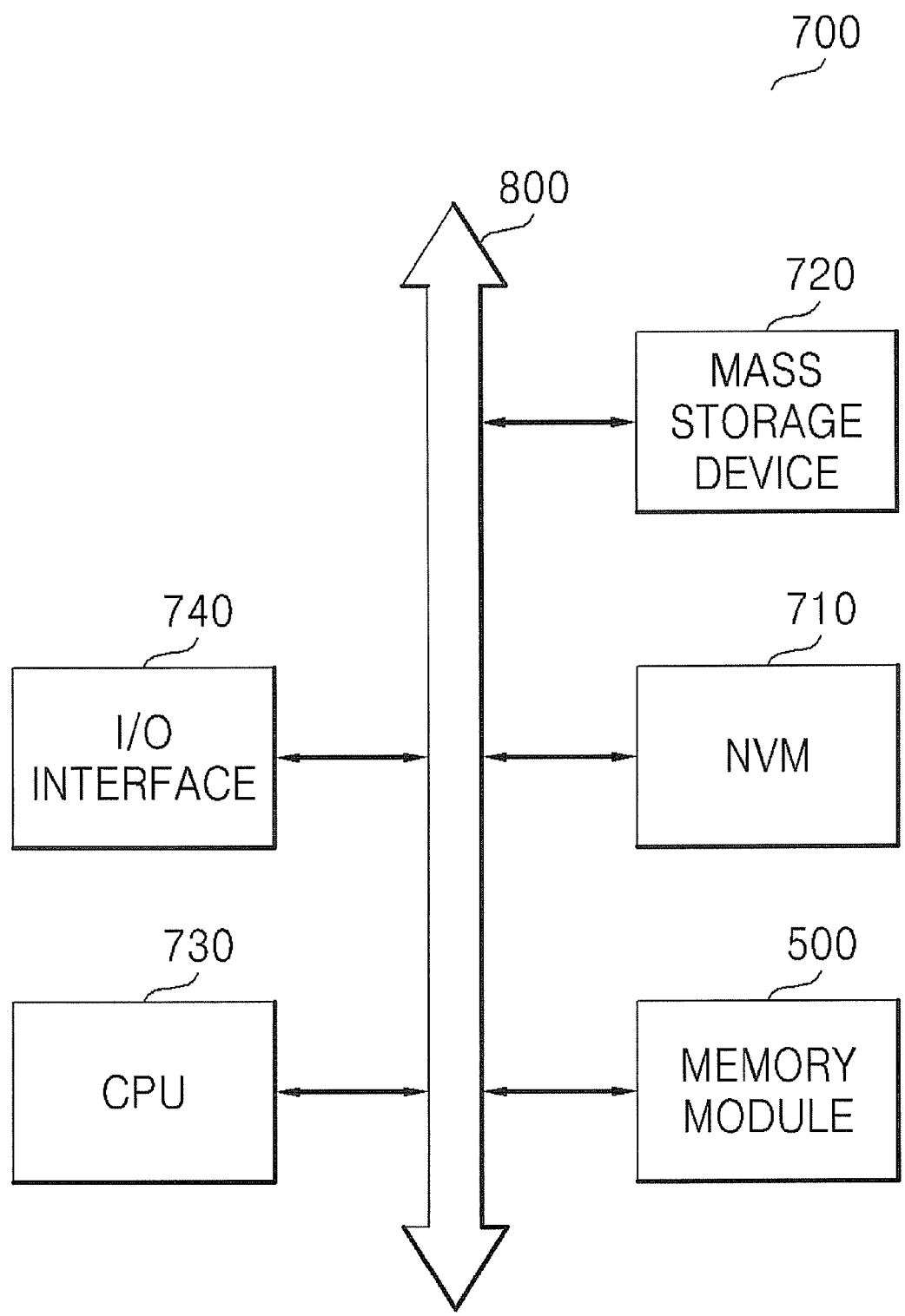
FIG. 9 is a diagram of an electronic system According to at least some of the example embodiments.

FIG. 9 is a diagram of an electronic system 700 According to at least some of the example embodiments. The electronic system 700 includes the memory module 500, a nonvolatile memory (NVM) 710, a mass storage device 720, a central processing unit (CPU) 730, and an I/O interface 740, which may be connected with one another via a bus 800.

The NVM 710 may include any type of nonvolatile memory including, for example, one or more of flash memory, phase-change random access memory (PRAM), and magnetic RAM (MRAM). The mass storage device 720 may include any type of storage device including, for example, a solid state drive (SSD), a hard disk drive (HDD) and a network-attached storage (NAS). The NVM 710 or the mass storage device 720 may store operating system files and other application files.

The I/O interface 740 may be connected to a network port that can access networks or may be connect directly to the networks.

During the operation of the electronic system 700, the CPU 730 may control the memory module 500 so that the semiconductor memory device 100 refreshes word lines based on refresh information corresponding to the semiconductor memory device 100.

Here, particular components of the electronic system 700 may be changed. For instance, the CPU 730 may be one of various types of CPUs and the semiconductor memory device 100 may be any one of various types of memory including DRAM and other memories requiring a refresh. The electronic system 700 is not restricted to the embodiments illustrated in FIG. 9 and may include additional components.

As described above, according to at least some example embodiments, a refresh operation of a semiconductor memory device is carried out according to refresh information of the semiconductor memory device in a memory system, thereby increasing bus efficiency and reducing refresh power. As a result, the performance of the memory system is increased.

The methods and functions described above, for example with respect to FIG. 7, may be embodied as computer-readable codes on a computer-readable medium. The computer-readable recording medium may be any data storage device that can store data as a program which can be thereafter read by a computer system. Examples of the computer-readable recording medium include read-only memory (ROM), random-access memory (RAM), CD-ROMs, magnetic tapes, floppy disks, and optical data storage devices. The computer-readable recording medium can also be distributed over network coupled computer systems so that the computer-readable code is stored and executed in a distributed fashion. Further, functional programs, codes, and code segments for accomplishing the methods and functions described above, when stored on a computer readable medium and executed by a processor, can be constructed by programmers skilled in the related art.

Example embodiments having thus been described, it will be obvious that the same may be varied in many ways. Such variations are not to be regarded as a departure from the intended spirit and scope of example embodiments, and all such modifications as would be obvious to one skilled in the art are intended to be included within the scope of the following claims.

What is claimed is:

1. A memory system comprising:
    a semiconductor memory device including a plurality of memory cells; and
    a memory controller configured to generate a special command for searching for refresh information stored in the semiconductor memory device and to control a refresh operation of the semiconductor memory device,
    wherein the semiconductor memory device is configured to output the refresh information to the memory controller in response to the special command generated by the memory controller, and
    wherein the memory controller includes,
        a command generator configured to generate the special command for searching for the refresh information corresponding to the semiconductor memory device before generating commands for controlling other operations of the semiconductor memory device;
        a memory register storage device configured to store the refresh information output from the semiconductor memory device;
        a pulse generator configured to generate and output a refresh pulse corresponding to the refresh information in response to a refresh command generated by the command generator; and
        an address counter configured to sequentially generate a row address for selecting a word line connected with a memory cell to be refreshed among the plurality of memory cells in response to the refresh pulse.

2. The memory system of claim 1, wherein the refresh information indicates one of a plurality of refresh intervals, the refresh intervals are grouped by predetermined ranges of the refresh intervals and the semiconductor memory device further comprises a special register configured to store a bit value corresponding to a refresh interval of the semiconductor memory device from among the plurality of refresh intervals.

3. The memory system of claim 2, wherein the special register is configured to output the refresh information of the semiconductor memory device stored in the form of the bit value to the memory register storage device in response to the special command received from the command generator.

4. The memory system of claim 1, wherein the semiconductor memory device further includes,
    a status register read (SRR) circuit configured to store SRR data including status information of the semiconductor memory device and the refresh information indicating a refresh interval of the semiconductor memory device in a form of one or more bit values.

5. The memory system of claim 4, wherein the SRR circuit is configured to output the SRR data and the refresh information to the memory register storage device in response to an SRR command generated by the command generator.

6. A refresh control method of a memory system, the refresh control method comprising:
    applying a special command to a semiconductor memory device for controlling the semiconductor memory device to search for refresh information stored in the semiconductor memory device;
    outputting from the semiconductor memory device the refresh information in response to the special command; and
    controlling a refresh operation of the semiconductor memory device according to the refresh information, wherein controlling the refresh operation of the semiconductor memory device according to the refresh information includes,
storing the refresh information output from the semiconductor memory device;
generating and outputting a refresh pulse corresponding to the refresh information in response to a refresh command for controlling the refresh operation of the semiconductor memory device; and
generating a row address for selecting a word line connected with a memory cell to be refreshed in the semiconductor memory device in response to the refresh pulse.

7. The refresh control method of claim 6, wherein applying the special command includes generating the special command before generating commands for controlling other operations of the semiconductor memory device.

8. The refresh control method of claim 6, wherein controlling the refresh operation of the semiconductor memory device according to the refresh information further includes storing a bit value corresponding to a refresh interval of the semiconductor memory device before the semiconductor memory device outputs the refresh information in response to the special command, the refresh interval of the semiconductor memory device being one of a plurality of different refresh intervals, the plurality of refresh intervals being grouped into different refresh interval ranges.

9. The refresh control method of claim 8, wherein the semiconductor memory device outputs the refresh information of the semiconductor memory device stored in the form of the bit value in response to the special command.

10. The refresh control method of claim 6, further comprising:
storing SRR data including status information of the semiconductor memory device and the refresh information indicating a refresh interval of the semiconductor memory device in a form of bit values.

11. The refresh control method of claim 10, wherein the semiconductor memory device outputs the SRR data and the refresh information in response to an SRR command for searching the refresh information of the semiconductor memory device.

12. A non-transitory computer readable recording medium storing executable code that, when executed by a computer, causes the computer to perform the refresh control method of claim 6.

13. A memory device for storing data in response to control signals of a memory controller, the memory device comprising:
a plurality of memory cells;
a refresh control circuit configured to perform a refresh operation on the plurality of memory cells in response to a refresh pulse received from the memory controller; and
a refresh information storage device configured to store refresh characteristic information and to provide the refresh characteristic information to the memory controller in response to a request command from the memory controller,
wherein the refresh characteristic information is a bit value corresponding to one of a plurality of different refresh intervals, each of the plurality of refresh intervals corresponding, respectively, to a different bit value.

14. The memory device of claim 13, wherein the refresh information storage device is a status register read (SRR) circuit configured to store SRR data including status information of the semiconductor memory device and the refresh characteristic information.

15. The memory device of claim 13, further comprising:
a status register read (SRR) circuit configured to store SRR data, the SRR circuit being separate from the refresh information storage device.

* * * * *